(12) United States Patent
Watts et al.

(10) Patent No.: US 9,148,978 B2
(45) Date of Patent: Sep. 29, 2015

(54) COOLING FLOW ACCELERATOR

(75) Inventors: Christopher F D. Watts, Hertfordshire (GB); Alexandra C. Davies, Berkshire (GB)

(73) Assignee: Xerox Corporation, Norwalk, CT (US)

( * ) Notice: Subject to any disclaimer, the term of this patent is extended or adjusted under 35 U.S.C. 154(b) by 632 days.

(21) Appl. No.: 13/450,873

(22) Filed: Apr. 19, 2012

(65) Prior Publication Data

US 2013/0276891 A1    Oct. 24, 2013

(51) Int. Cl.
| F15D 1/04 | (2006.01) |
| H05K 7/20 | (2006.01) |
| G03G 21/20 | (2006.01) |
| H01L 23/467 | (2006.01) |

(52) U.S. Cl.
CPC .......... *H05K 7/20145* (2013.01); *G03G 21/206* (2013.01); *H01L 23/467* (2013.01); *H01L 2924/0002* (2013.01); *Y10T 137/0318* (2015.04)

(58) Field of Classification Search
CPC ............. H05K 7/20145; H01L 23/467; G03G 21/206; Y10T 137/0318
USPC ................... 454/184, 188, 89, 190, 191, 192; 138/39; 137/1
See application file for complete search history.

(56) References Cited

U.S. PATENT DOCUMENTS

| 3,047,208 A | 7/1962 | Coanda |
| 3,270,655 A | 9/1966 | Guirl et al. |
| 3,394,755 A * | 7/1968 | Morrison ...................... 165/103 |
| 3,743,186 A | 7/1973 | Mocarski |
| 3,817,160 A * | 6/1974 | Searcy et al. .................. 454/188 |
| 3,859,900 A * | 1/1975 | Fordsmand .................... 454/190 |
| 3,885,891 A | 5/1975 | Throndson |
| 4,046,492 A | 9/1977 | Inglis |
| 4,192,461 A | 3/1980 | Arborg |
| 4,195,780 A | 4/1980 | Inglis |
| 4,253,384 A * | 3/1981 | Schmidt et al. ............... 454/284 |
| 4,261,519 A * | 4/1981 | Ester ............................. 239/548 |
| 4,385,728 A | 5/1983 | Inglis et al. |
| 4,930,705 A | 6/1990 | Broerman |
| 5,296,769 A | 3/1994 | Havens et al. |
| 5,338,254 A * | 8/1994 | Farrington .................... 454/284 |
| 5,402,938 A | 4/1995 | Sweeney |
| 5,609,305 A | 3/1997 | Webb |

(Continued)

OTHER PUBLICATIONS http://www.itttreatment.com/ProductPDF/jet_mixer.pdf, Apr. 18, 2012, pp. 1-8.

*Primary Examiner* — Gregory Huson
*Assistant Examiner* — Dana Tighe
(74) *Attorney, Agent, or Firm* — Gibb & Riley, LLC

(57) ABSTRACT

An air flow accelerator for creating an air current. The air flow accelerator comprises an air inlet, an air outlet, an impeller, and a motor for rotating the impeller to create an air flow passing from the air inlet to the air outlet. The air outlet comprises a first elongate plenum having an interior passage for receiving the air flow, and a second elongate plenum connected to the first elongate plenum by a common wall between the first elongate plenum and the second elongate plenum. The common wall has a plurality of apertures therein. The second elongate plenum comprises a plurality of chambers such that one or more of the apertures connects to each of the chambers. The second elongate plenum further comprises a narrow slot for emitting the air flow. The air flow emitting from the slot forms a jet inducing a flow of air from outside the air flow accelerator.

17 Claims, 6 Drawing Sheets

(56) References Cited

U.S. PATENT DOCUMENTS

| | | |
|---|---|---|
| 6,123,618 A | 9/2000 | Day |
| 6,282,746 B1 | 9/2001 | Schleeter |
| 6,386,845 B1 | 5/2002 | Bedard |
| 6,537,036 B1 | 3/2003 | Broerman et al. |
| 7,654,085 B2 | 2/2010 | Dumas et al. |
| 8,029,244 B2 | 10/2011 | Dumas et al. |
| 8,052,379 B2 | 11/2011 | Gammack |
| 2011/0110805 A1 | 5/2011 | Gammack et al. |

* cited by examiner

COOLING FLOW ACCELERATOR

BACKGROUND

Embodiments herein generally relate to fluid flow amplifiers, and in particular to a device that can be installed on a louvered cabinet to increase the volume of air provided to the cabinet.

Traditional methods of electronics cooling within photocopiers, and the like, rely on either passive (heat sink and buoyancy) or active (forced airflow using fans or blowers) methods. With the extended enterprise model of module supply, each supplier is responsible for the effective operation of their sub-system. When combining several distributed electronics modules into one zone within a machine there is a tendency to miss the opportunity to combine the cooling function, each module sticking with its own cooling strategy. This may result in a number of fans, all creating noise and using power, with reducing Ecolabel limits for both parameters, this is becoming a greater concern.

There remains a need for a new and useful air cooling device that avoids or minimizes the disadvantages of multiple fans and blowers. The embodiments herein provide such a new and useful device.

SUMMARY

In view of the foregoing, disclosed herein are embodiments that use a carefully shaped and positioned ducting section to enhance the cooling efficiency of a single fan/blower. The blower alone would be insufficient to cool all the electronics systems in an enclosure, additional blowers or fans would add complexity, cost, noise, and increase power consumption. The ducting distributes the air flow evenly across the back of the machine, accelerates the flow through a small slot, which has a dual function of guiding the flow, through the colander effect, along the surface of the tail, thus allowing the flow to be accurately directed and inducing a higher bulk flow from outside the machine through louvers in the rear cover. An induced flow of approximately four times the initial flow from the blower has been demonstrated. Using this system, rather than three more blowers equates to a 6 dB reduction in noise, only 25% of the power consumption, and significant unit manufacturing cost saving.

According to an embodiment herein, a device for accelerating air flow is disclosed. The device comprises a first elongate plenum having an interior passage. A second elongate plenum is connected to the first elongate plenum. A common wall is located between the first elongate plenum and the second elongate plenum. The common wall has a plurality of apertures therein. The second elongate plenum comprises a plurality of chambers such that one or more of the apertures connects to each of the chambers. The second elongate plenum further comprises a narrow slot for emitting air flow. The air flow emitting from the slot forms a jet inducing a flow of air from outside the device. A blower admits a flow of air to the first elongate plenum.

According to another embodiment herein an air flow accelerator is disclosed. The air flow accelerator comprises an air inlet, an air outlet, an impeller, and a motor for rotating the impeller to create an air flow passing from the air inlet to the air outlet. The air outlet comprises a first elongate plenum having an interior passage for receiving the air flow, and a second elongate plenum connected to the first elongate plenum by a common wall between the first elongate plenum and the second elongate plenum. The common wall has a plurality of apertures therein. The second elongate plenum comprises a plurality of chambers such that one or more of the apertures connects to each of the chambers. The second elongate plenum further comprises a narrow slot for emitting the air flow. The air flow emitting from the slot forms a jet inducing a flow of air from outside the air flow accelerator.

According to another embodiment herein, a method of increasing air flow is disclosed. The method comprises feeding air into a first end of a first elongate plenum. A flow of the air is evenly distributed to a second elongate plenum connected to the first elongate plenum. The flow of air is restricted through a plurality of apertures in a common wall between the first elongate plenum and the second elongate plenum. The second elongate plenum comprises a plurality of chambers such that one or more of the apertures connects to each of the chambers. The air is allowed to escape through a small slot in the second elongate plenum. The escaping air forms a jet. The jet induces a flow of air from outside the first and second plenum.

These and other features are described in, or are apparent from, the following detailed description.

BRIEF DESCRIPTION OF THE DRAWINGS

Various exemplary embodiments of the systems and methods are described in detail below, with reference to the attached drawing figures, in which.

DETAILED DESCRIPTION

Embodiments herein disclose using a "cooling flow accelerator" and a single fan to cool the electrical components in a printer or other similar electronics cabinet. In a cooling flow accelerator, air is fed in from one end of the lower cavity and is distributed evenly by the restriction to flow presented by small orifices in the adjoining wall. The upper cavity allows the air to escape through a small slot, which forms a jet, thus inducing a flow outside the system, increasing the overall cooling performance of the printer when placed at the rear base of the printer product. The cooling flow accelerator was developed to limit the number of cooling fans required to cool electrical components and reduce cost, noise and power consumption. Benefits of the embodiments herein include reduced unit manufacturing costs and audible noise, and improved heat dissipation.

Figure 1:
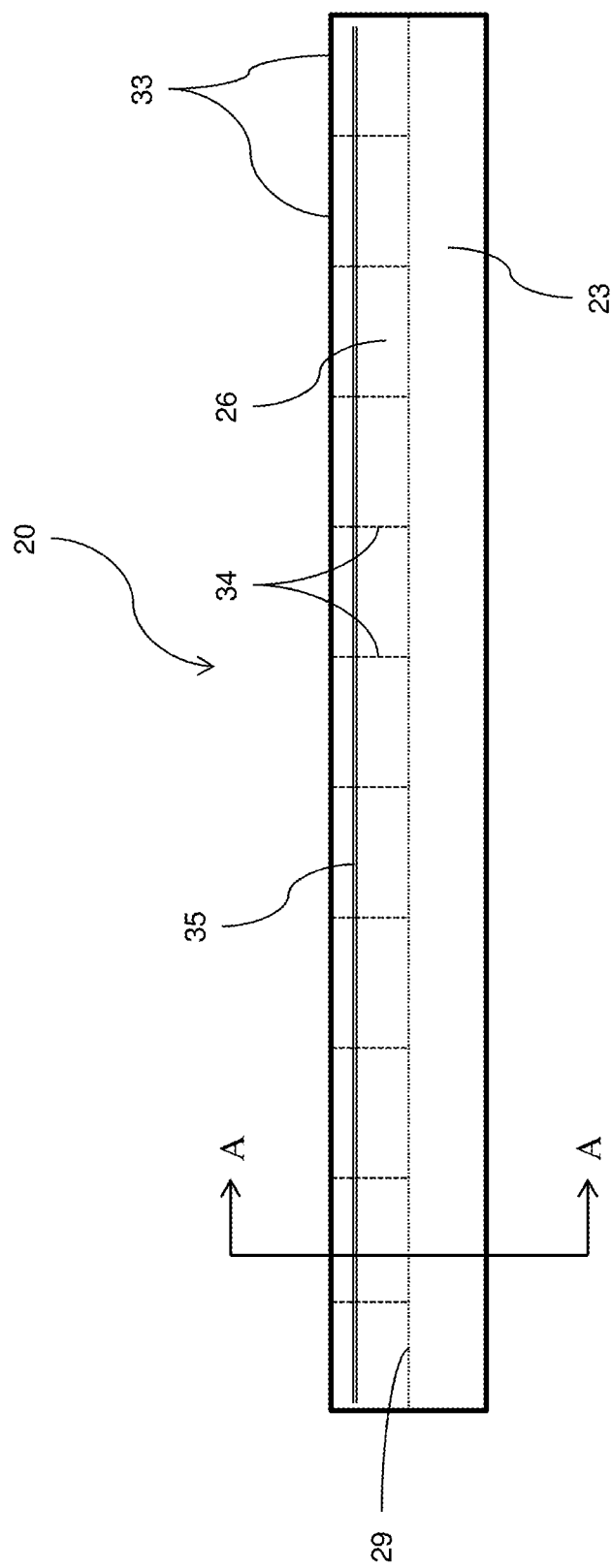
FIG. 1 is an elevational view of an air flow accelerator according to embodiments herein.
Figure 2:
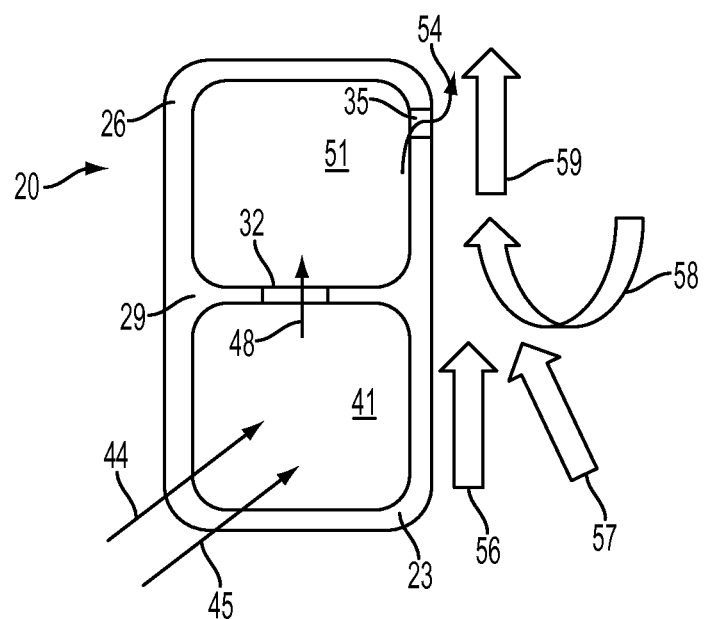
FIG. 2 is a cross-sectional view of the air flow accelerator taken along the line A-A of FIG. 1.

Referring to the drawings, particularly to FIGS. 1 and 2, the air flow accelerator, indicated generally as 20, comprises a first elongate plenum 23 having an interior passage. A second elongate plenum 26 is connected to the first elongate plenum 23. A common wall 29 is located between the first elongate plenum 23 and the second elongate plenum 26. The common wall 29 has a plurality of apertures 32 therein. In some embodiments, the second elongate plenum 26 may comprise a series of chambers 33 having a wall, such as 34, perpendicular to the common wall 29 and separating adjacent chambers, such that one or more apertures 32 connects to each chamber 33. The second elongate plenum 26 further comprises a narrow slot 35 that creates a nozzle for emitting air flow. The air flow emitting from the slot 35 forms a jet inducing a flow of air from outside the air flow accelerator 20. A blower 38 (shown in FIG. 4) admits a flow of air to the first elongate plenum 23. The air pressure in the first elongate plenum 23 is higher than the air pressure in the second elongate plenum 26.

As shown in FIG. 2, the air flow accelerator is a hollow device with two cavities 41, 51. Air flow balancing is accomplished by the apertures 32 between the two cavities. The air flow exits the device through the slot 35 in the second cavity 51. FIG. 2 shows air is fed in from one end of the first cavity 41 and admitted to the first elongate plenum 23, indicated by arrows 44, 45. The air flow, indicated by arrow 48, is distributed evenly by the restriction to flow presented by apertures 32 in the common wall 29 to the plurality of chambers 33. The second cavity 51 allows the air to escape, indicated by arrow 54, through slot 35, which forms a jet, thus inducing a flow outside the system indicated by arrows 56, 57, 58, 59, increasing the overall cooling performance.

Figure 3:
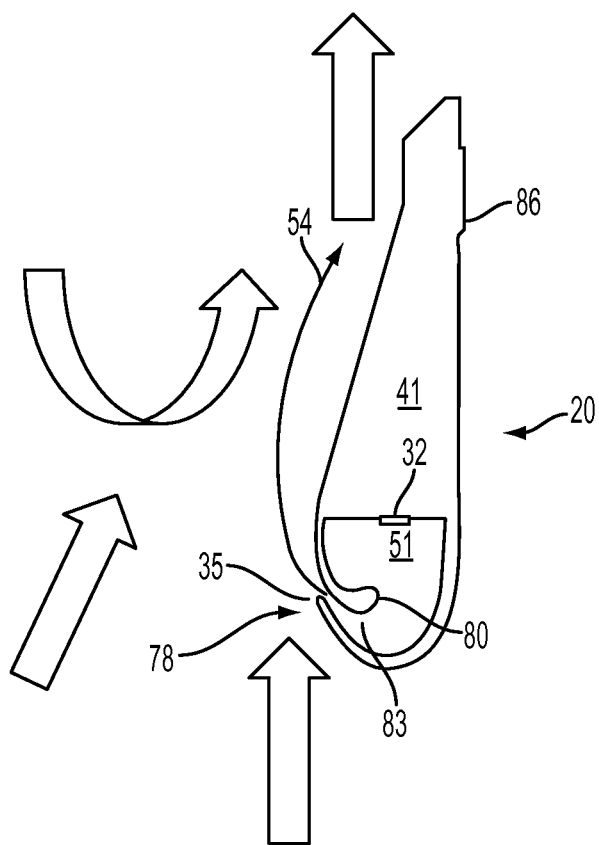
FIG. 3 is a profile view of an air flow accelerator according to embodiments herein.

FIG. 3 shows an exemplary profile of an air flow accelerator according to embodiments herein. As shown in FIG. 3, the slot 35 in the second cavity 51 may include a tongue 80 and throat 83 carefully shaped and positioned to form a nozzle 78 that increases the velocity of the air flow exiting the slot 35. Additionally, the outer wall of the first cavity 41 may be shaped as a foil portion 86 to direct the air flow stream across the contour of the foil portion 86 in order to enhance the cooling efficiency of a single fan/blower 38. The foil portion may be slightly concave shaped to entrain ambient air in the air flow stream.

Figure 4:
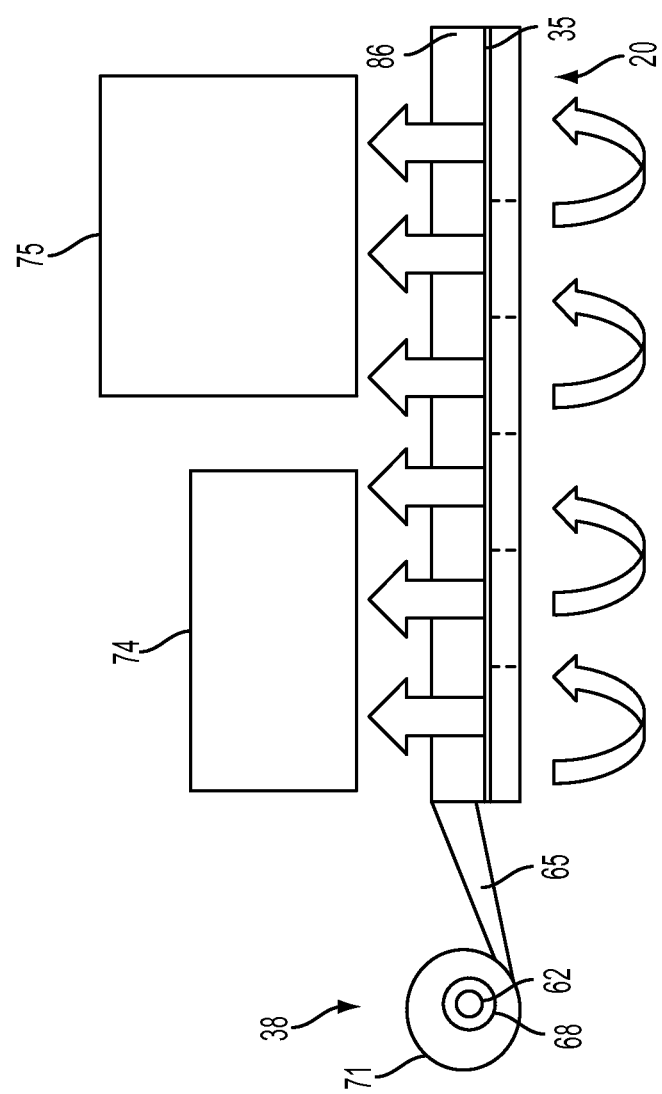
FIG. 4 is a block diagram of an air flow accelerator according to embodiments herein.

As shown in FIG. 4, the blower 38 comprises an air inlet 62, an air outlet 65, an impeller 68, and a motor 71 for rotating the impeller 68 to create an air flow passing from the air inlet 62 to the air outlet 65. The air outlet 65 feeds air into a first elongate plenum 23 having an interior passage for receiving the air flow, and a second elongate plenum 26 connected to the first elongate plenum 23 by a common wall 29 between the first elongate plenum 23 and the second elongate plenum 26. The common wall 29 has a plurality of apertures 32 therein. The second elongate plenum 26 may comprise a series of chambers 33 such that one or more apertures 32 connects to each chamber 33. The second elongate plenum 26 further comprises a narrow slot 35 that forms a nozzle for emitting the air flow. The air flow emitting from the slot forms a jet inducing a flow of air across the foil portion 86 outside the air flow accelerator. The air flow can be directed for cooling of electronic components, such as 74, 75, which may be located in a printer or other enclosure.

According to embodiments herein, the air flow accelerator 20 may be placed inside an enclosure, such as a printer, a machine, or a cabinet, typically at the base. Air is drawn from the rear of the enclosure through louvers by the blower 38, into the air inlet 62 and forced, under pressure, through the air outlet 65 into the first cavity 41 of the air flow accelerator 20. The flow of air is evenly distributed to the second cavity 51 through the plurality of apertures 32. The air then exits the second cavity 51 through the slot 35, forming a jet of air. Thus, the exiting jet and induced airflow across the foil portion will form a bulk movement upwards within the machine, supporting the natural buoyancy cooling already in place. In some embodiments, the second cavity 51 may comprise a series of chambers 33 having a wall, such as 34, perpendicular to the common wall 29 and separating adjacent chambers, such that one or more apertures 32 connects to each chamber 33.

Figure 5:
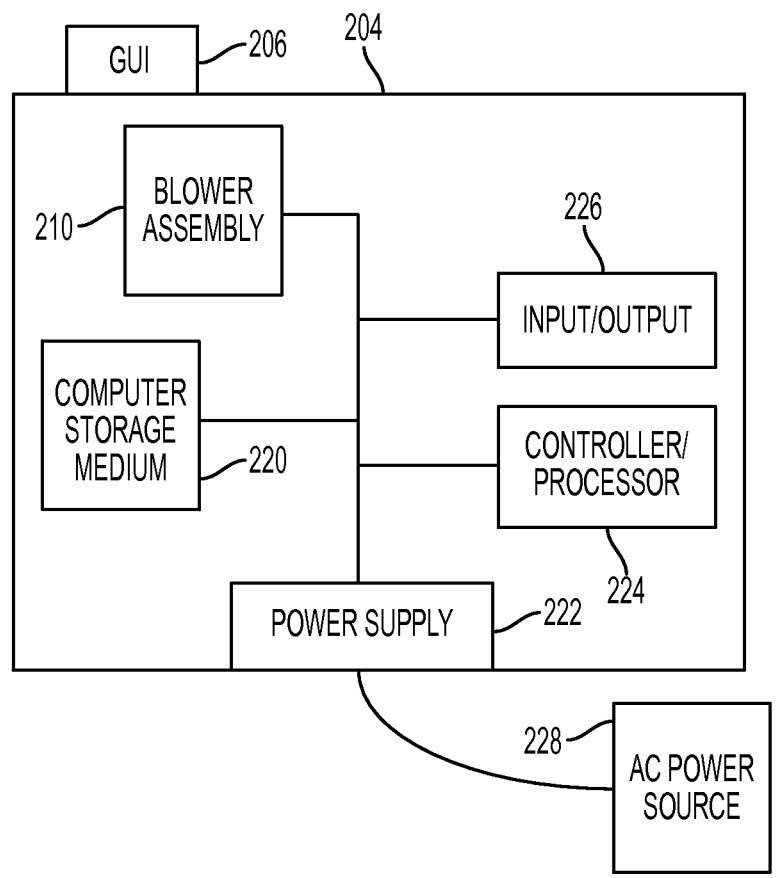
FIG. 5 is a cross-sectional schematic diagram of an enclosure according to embodiments herein.

FIG. 5 illustrates an enclosure 204 that can be used with embodiments herein. The enclosure 204 includes a controller/processor 224 and a communications port (input/output) 226 operatively connected to the processor 224 and may be connected to a computerized network external to the enclosure 204. Also, the enclosure 204 can include at least one accessory functional component, such as a graphic user interface assembly 206, that also operates on the power supplied from the external power source 228 (through the power supply 222).

The enclosure 204 includes a blower assembly 210 operatively connected to the processor 224. The blower assembly includes at least the blower 38 and motor 71.

The input/output device 226 is used for communications to and from the enclosure 204. The processor 224 controls the operation of the blower assembly 210. A non-transitory computer storage medium device 220 (which can be optical, magnetic, capacitor based, etc.) is readable by the processor 224 and stores instructions that the processor 224 executes to allow the blower assembly 210 to perform its function, such as those described herein. Thus, as shown in FIG. 5, an enclosure 204 has one or more functional components that operate on power supplied from the alternating current (AC) power source 228 through the power supply 222. The power supply 222 can comprise a power storage element (e.g., a battery) and connects to an external AC power source 228 and converts the external power into the type of power needed by the various components.

Figure 6:
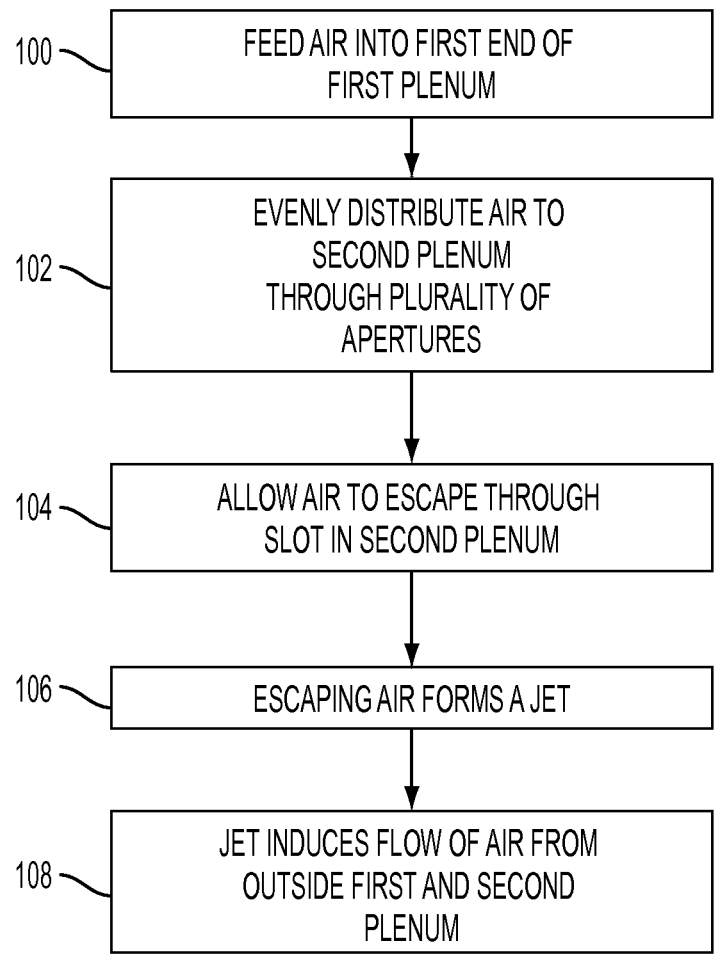
FIG. 6 is a flow diagram of a method according to embodiments herein.

It should be understood that the term "controller" as used herein comprises a computerized device adapted to perform (i.e., programmed to perform, configured to perform, etc.) the above described system operations (e.g., controlling cleaning roller movement, controlling cleaning roller rotation, etc.). Preferably this controller comprises a programmable, self-contained, dedicated mini-computer having a central processor unit (CPU), electronic storage, and a display or user interface (UI) and can function as the main control system for either a stand-alone document production system or multiple modules (e.g., the feeder module(s), stacker module(s), interface modules(s) printing module(s), cleaning modules, binding modules, etc.) within a modular document production system. Computerized devices that include chip-based central processing units (CPU's), input/output devices (including graphic user interfaces (GUI), memories, comparators, processors, etc. are well-known and readily available devices produced by manufacturers such as Dell Computers, Round Rock Tex., USA and Apple Computer Co., Cupertino Calif., USA. Such computerized devices commonly include input/output devices, power supplies, processors, electronic storage memories, wiring, etc., the details of which are omitted herefrom to allow the reader to focus on the salient aspects of the embodiments described herein. Similarly, scanners and other similar peripheral equipment are available from Xerox Corporation, Norwalk, Conn., USA, and the details of such devices are not discussed herein for purposes of brevity and reader focus. In accordance with embodiments herein, a flow chart for the method of increasing air flow is shown in FIG. 6. The method comprises feeding air into a first end of a first elongate plenum 100. The flow of air is evenly distributed to a second elongate plenum connected to the first elongate plenum through a plurality of apertures in a common wall between the first elongate plenum and the second elongate plenum 102. The air is allowed to escape through a small slot in the second elongate plenum 104. The escaping air forms a jet 106. The jet induces a flow of air from outside the first and second plenum 108.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It will be appreciated that the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims. The claims can encompass embodiments in hardware, software, and/or a combination thereof. Unless specifically defined in a specific claim itself, steps or components of the embodiments herein should not be implied or imported from any above example as limitations to any particular order, number, position, size, shape, angle, color, or material.

What is claimed is:

1. A device for accelerating air flow, comprising:
   a first elongate plenum;
   a second elongate plenum connected to said first elongate plenum;
   a common wall between said first elongate plenum and said second elongate plenum, said common wall having a plurality of apertures therein,
      said second elongate plenum comprising a plurality of chambers having a wall perpendicular to said common wall separating adjacent chambers, such that one or more of said apertures connects to each of said plurality of chambers, said second elongate plenum further comprising a slot that emits air flow, said slot comprising a tongue and throat, said tongue and said throat being shaped and positioned to increase velocity of said air flow emitting from said slot, said air flow emitting from said slot forming a jet that induces a flow of air from outside said device; and
   a blower admitting a flow of air to said first elongate plenum.

2. The device according to claim 1, each of said first elongate plenum and said second elongate plenum further comprising a hollow interior passage.

3. The device according to claim 1, said plurality of apertures balancing air flow from said first plenum to said second plenum.

4. The device according to claim 1, further comprising a shaped foil portion directing said air flow emitting from said slot.

5. The device according to claim 1, said blower comprising:
   an impeller; and
   a motor that rotates said impeller to create an air flow.

6. The device according to claim 5, said blower further comprising:
   an air inlet; and
   an air outlet, said air outlet being connected to said first elongate plenum.

7. An air flow accelerator comprising:
   an air inlet;
   an air outlet;
   an impeller; and
   a motor rotating said impeller and creating an air flow passing from said air inlet to said air outlet,
   said air outlet comprising:
      a first elongate plenum receiving said air flow, and
      a second elongate plenum connected to said first elongate plenum by a common wall between said first elongate plenum and said second elongate plenum, said common wall having a plurality of apertures therein,
      said second elongate plenum comprising a plurality of chambers having a wall perpendicular to said common wall separating adjacent chambers, one or more of said apertures being connected to each of said plurality of chambers, said second elongate plenum further comprising a slot emitting said air flow, said slot comprising a tongue and throat, said tongue and said throat being shaped and positioned to increase velocity of said air flow emitting from said slot, said air flow emitting from said slot forming a jet inducing a flow of air from outside said air flow accelerator.

8. The air flow accelerator according to claim 7, each of said first elongate plenum and said second elongate plenum further comprising a hollow interior passage.

9. The air flow accelerator according to claim 7, said plurality of apertures balancing air flow from said first plenum to said second plenum.

10. The air flow accelerator according to claim 7, further comprising a shaped foil portion directing said air flow emitting from said slot.

11. The air flow accelerator according to claim 7, said air flow accelerator being located inside one of a printer, a machine, and a cabinet.

12. A method of increasing air flow, comprising:
   feeding air into a first end of a first elongate plenum;
   evenly distributing a flow of said air to a second elongate plenum connected to said first elongate plenum by restricting said flow of said air through a plurality of apertures in a common wall between said first elongate plenum and said second elongate plenum, said second elongate plenum comprising a plurality of chambers having a wall perpendicular to said common wall, said wall perpendicular to said common wall separating adjacent chambers such that one or more of said apertures connects to each of said plurality of chambers;
   allowing said air to escape through a slot in said second elongate plenum, said air escaping through said slot forming a jet, said slot comprising a tongue and throat, said tongue and said throat being shaped and positioned to increase velocity of said air flow emitting from said slot; and said jet inducing a flow of air from outside said second elongate plenum.

13. The method according to claim 12, each of said first elongate plenum and said second elongate plenum further comprising a hollow interior passage.

14. The method according to claim 12, said plurality of apertures balancing air flow from said first plenum to said second plenum.

15. The method according to claim 12, further comprising:
   directing said air flow emitting from said slot over a shaped foil.

16. The method according to claim 12, said feeding air into a first end of a first elongate plenum comprising:
   rotating a motor connected to an impeller to create an air flow.

17. The method according to claim 12, further comprising:
   admitting air to a blower;
   increasing pressure of said air; and
   directing said air to an outlet of said blower, said outlet being connected to said first end of said first elongate plenum.

\* \* \* \* \*